United States Patent
Jang

(10) Patent No.: US 10,420,259 B2
(45) Date of Patent: Sep. 17, 2019

(54) MULTIFUNCTIONAL HYBRID MODULE AND PORTABLE DEVICE COMPRISING SAME

(71) Applicant: Amosense Co., Ltd., Cheonan-si (KR)

(72) Inventor: Kil Jae Jang, Seongnam-si (KR)

(73) Assignee: Amosense Co., Ltd., Cheonan-si (KR)

( * ) Notice: Subject to any disclaimer, the term of this patent is extended or adjusted under 35 U.S.C. 154(b) by 0 days.

(21) Appl. No.: 15/765,570

(22) PCT Filed: Oct. 5, 2016

(86) PCT No.: PCT/KR2016/011148
§ 371 (c)(1),
(2) Date: Apr. 3, 2018

(87) PCT Pub. No.: WO2017/061772
PCT Pub. Date: Apr. 13, 2017

(65) Prior Publication Data
US 2019/0082564 A1    Mar. 14, 2019

(30) Foreign Application Priority Data
Oct. 5, 2015  (KR) ........................ 10-2015-0140024

(51) Int. Cl.
*H05K 9/00* (2006.01)
*H01Q 7/00* (2006.01)
(Continued)

(52) U.S. Cl.
CPC ......... *H05K 9/0083* (2013.01); *H01Q 1/2208* (2013.01); *H01Q 1/2283* (2013.01);
(Continued)

(58) Field of Classification Search
CPC .................................................. H05K 9/0083
See application file for complete search history.

(56) References Cited

U.S. PATENT DOCUMENTS

| 9,236,662 B2 | 1/2016 | Jang et al. |
| 9,252,611 B2 | 2/2016 | Lee et al. |

(Continued)

FOREIGN PATENT DOCUMENTS

| KR | 10-2013-0072181 A | 7/2013 |
| KR | 10-2013-0111731 A | 10/2013 |

(Continued)

OTHER PUBLICATIONS

International Search Report dated Feb. 10, 2017 for International Application No. PCT/KR2016/011148; 4 Pages.

*Primary Examiner* — Hung V Ngo
(74) *Attorney, Agent, or Firm* — Daly, Crowley, Mofford & Durkee, LLP

(57) ABSTRACT

A multifunctional integrated module is provided. The multifunctional integrated module includes an antenna unit including heterogeneous antennas and a magnetic field shielding unit, disposed on one surface of the antenna unit, including a magnetic field shielding layer which includes shredded Fe-based alloy fragments and a dielectric filling at least a part of gaps between at least a part of some adjacent ones of the shredded Fe-based alloy fragments, to improve the characteristics of the antennas and condense a magnetic flux toward the antennas. According to this, although the functions are performed simultaneously, the respective functions are excellently expressed at the same time, and the durability can be ensured by preventing the deterioration of the function even with external physical shocks during use.

11 Claims, 8 Drawing Sheets

(51) Int. Cl.
*H02J 7/02* (2016.01)
*H04B 5/00* (2006.01)
*H01Q 5/307* (2015.01)
*H01Q 1/22* (2006.01)
*H01Q 17/00* (2006.01)
*H01Q 21/30* (2006.01)
*H01Q 3/44* (2006.01)

(52) U.S. Cl.
CPC ............... *H01Q 5/307* (2015.01); *H01Q 7/00* (2013.01); *H01Q 17/002* (2013.01); *H01Q 21/30* (2013.01); *H02J 7/02* (2013.01); *H04B 5/00* (2013.01); *H05K 9/0075* (2013.01); *H01Q 1/2225* (2013.01); *H01Q 3/44* (2013.01)

(56) References Cited

U.S. PATENT DOCUMENTS

| | | | |
|---|---|---|---|
| 2016/0064814 A1 | 3/2016 | Jang et al. | |
| 2016/0081240 A1 | 3/2016 | Lee et al. | |
| 2017/0054213 A1* | 2/2017 | Singh | H01Q 7/06 |

FOREIGN PATENT DOCUMENTS

| | | |
|---|---|---|
| KR | 10-1480012 B1 | 1/2015 |
| KR | 10-2015-0045421 A | 4/2015 |
| KR | 10-2015-0070057 A | 6/2015 |

\* cited by examiner

MULTIFUNCTIONAL HYBRID MODULE AND PORTABLE DEVICE COMPRISING SAME

CROSS-REFERENCE TO RELATED APPLICATION

This application is a U.S. National Stage of PCT/KR2016/011148 filed in the Korean language on Oct. 5, 2016, entitled: "Multifunctional Hybrid Module And Portable Device Comprising Same" which application claims priority to Korean Application No. 10-2015-0140024 filed on Oct. 5, 2015, which applications are each hereby incorporated herein by reference in their entireties.

BACKGROUND

1. Technical Field

The present disclosure relates to an integrated module, and more particularly to a multifunctional integrated module and a portable device in which each function is excellently expressed in spite of performing the multifunction, and durability is secured by preventing deterioration in performance even when an external physical impact is applied during use.

2. Discussion of the Related Art

Generally, an antenna is a device that converts an electric signal into a radio wave signal and classified into a dielectric antenna using dielectric characteristics and a magnetic antenna using magnetic properties. All antennas may be used in various application fields, and their efficiency depends on their shapes and structures. Conventionally, researches on dielectric antennas using high permittivity materials were actively conducted. Now, with the use of higher frequencies, the problem of performance degradation of antennas due to miniaturization has emerged. Studies on magnetic materials having high magnetic permeability are actively conducted for the high-permittivity materials. In recent years, attempts have been made to integrate various functions such as NFC (NFC), wireless power transmission (WPT), magnetic security transmission (MST), and the like through various portable terminal devices (smart phones, tablet PCs, and the like) utilizing these antennas.

The NFC, WPT and MST functions are performed by transmitting and receiving electromagnetic signals between a transmitting module and a receiving module. The electromagnetic wave signals are not only present between the transmitting module and receiving module but also leaked to the surrounding. Leaked electromagnetic wave may make problems such as a reduction of the transmission/reception efficiency, a shorten transmission/reception distances, and an adverse affectation for users using other components and devices disposed around the module.

To solve these problems, a magnetic field shielding material may be provided in the module to shield the other parts in the device from the magnetic field. In addition, the magnetic field shielding material induces the concentration of the magnetic field between the transmitting and receiving parts, thereby improving the transmission and reception and preventing the deterioration of functions of other parts due to the magnetic field.

The higher the magnetic permeability of the magnetic field shielding material, the better the transmission/reception efficiency. The magnetic permeability varies depending on the type of the magnetic body included in the magnetic field shielding material. In general magnetic body of any specific composition may exhibit different permeability characteristics depending on the manufacturing process such as sintering temperature, etc., and have a tendency with a large fluctuation width in permeability for each frequency band. Therefore, for improving the performance of the antenna provided in the transmission/reception module having the specific frequency band as an operating frequency, it is advantageous to use the magnetic field shielding material having an excellent magnetic permeability characteristic in the specific frequency band.

However, the antennas that perform the NFC, WPT, and MST functions have different frequency bands within the wide frequency band of 100 kHz to 13.56 MHz as the operating frequency. Any magnetic body does not have an excellent magnetic permeability throughout such a wide frequency band.

Recently, there is an attempt that a magnetic field shielding material including a magnetic body having an excellent magnetic permeability at a frequency corresponding to the operating frequency of each antenna is selected for each antenna, thereby integrating a plurality of magnetic shielding materials. However, the integrated magnetic shielding material may become thick. This is undesirable considering the tendency of small size and slim thickness in commercialized portable devices.

In addition, the conventional thin magnetic field shielding material may not avoid breakage of the magnetic body due to external impact. When the magnetic body is broken and separated into fragments, the magnetic properties may exhibit lower than the initial designed physical property. Therefore, the function of the module may not be exerted at a desired level.

Therefore, when a magnetic field shielding material is provided in a portable electronic device having a small size and slim thickness, each performance of heterogeneous antennas provided for the multifunction in one module should be simultaneously improved. In addition, it is required to develop the integrated module capable of preventing deterioration of functions due to the external impact.

SUMMARY

It is an object of the present disclosure to provide an integrated module capable of improving the characteristics of the antennas and the transmission/reception efficiency and the transmission/reception distance, even though the antennas for performing multi-function are integrated.

In addition, there is another object of the present disclosure to provide an integrated module which is very thin although characteristics of the antennas included in the module for performing multi-functions are improved at the same time, and can maintain the initial designed physical property in spite of impact during a manufacturing process or use of the product employing the same so that the transmission/reception performance of the module can be continuously presented.

It is another object of the present disclosure to provide a portable device and an electronic device in which transmission/reception efficiency of function-specific signals is enhanced and a transmission/reception distance range is increased through the integrated module according to the present disclosure.

To solve the above problem and defects, the present disclosure provides a multifunctional integrated module that includes an antenna unit including heterogeneous antennas; and a magnetic field shielding unit, disposed on a surface of the antenna unit, including a magnetic field shielding layer which includes shredded Fe-based alloy fragments and a dielectric filling at least a part of gaps between at least a part of some adjacent ones of the shredded Fe-based alloy fragments, configured to improve characteristics of the antennas and condense a magnetic flux toward the antennas.

In an embodiment of the present disclosure, the heterogeneous antennas may include antennas having different frequency bands from each other as their operating frequencies, or performing different functions from each other. The heterogeneous antennas may include at least two types of antennas among an NFC antenna, a MST antenna, and a WPT antenna. The heterogeneous antennas may include at least two types of antennas among a first antenna having an operating frequency band of 5 to 350 kHz, a second antenna having an operating frequency band including 6.78 MHz, and a third antenna having an operating frequency band including 13.56 MHz.

In an embodiment of the present disclosure, the magnetic field shielding unit may further include a protective member disposed on a surface of the magnetic field shielding layer and an adhesive member disposed on the other surface of the magnetic field shielding layer and attached to a surface of the antenna unit. The protective member may be adhered to a top surface of the magnetic field shielding layer through a first adhesive layer which forms a surface of the adhesive member which forms a surface of the adhesive member which forms a surface of the adhesive member. The adhesive member may be adhered to a bottom surface of the magnetic field shielding layer through a second adhesive layer which forms a surface of the adhesive member. The dielectric included in the magnetic field shielding layer may be formed such that a part of at least one of the first adhesive layer and the second adhesive layer permeates into the gaps between the Fe-based amorphous alloy fragments.

In an embodiment of the present disclosure, the Fe-based alloy may be a 3-element-based alloy including iron (Fe), silicon (Si) and boron (B) and/or a 5-element-based alloy including iron (Fe), silicon (Si), boron (B), copper (Cu), and niobium (Nb). The Fe-based alloy fragments may be derived from a Fe-based amorphous alloy ribbon. The Fe-based alloy fragments may have diameters of less than 1 µm to 5 mm, and irregular shapes.

In an embodiment of the present disclosure, the dielectric may fill up all of the gaps between adjacent Fe-based alloy fragments.

In an embodiment of the present disclosure, a single layer of the magnetic field shielding layers may have a thickness of 15 µm to 35 µm.

In an embodiment of the present disclosure, the magnetic field shielding unit may include a plurality of the magnetic field shielding layers, and a dielectric layer may be interposed between adjacent magnetic field shielding layers to adhere the adjacent magnetic field shielding layers to each other and reduce eddy currents.

In an embodiment of the present disclosure, the dielectric layer may be an insulating adhesive layer or a heat-conductive heat-radiating adhesive layer. In an embodiment of the present disclosure, any one of the magnetic field shielding layers may differ in permeability from the other of the magnetic field shielding layers.

In an embodiment of the present disclosure, the number of Fe-based alloy fragments of which diameters are less than 500 µm may account for 40% or more, further probably 80% or more of a total number of the Fe-based alloy fragments. The number of Fe-based alloy fragments of which diameter are less than 50 µm may account for 50% or less of the total number of the Fe-based alloy fragments.

In an embodiment of the present disclosure, the present disclosure provides a portable device including the multifunctional integrated module according to the present disclosure as a receiving module.

In an embodiment of the present disclosure, the present disclosure also provides an electronic device including the multifunctional integrated module according to the present disclosure.

Hereinafter, terms used in the present disclosure will be defined.

As used herein, the term "antenna" means any object that transmits and receives a signal.

According to the present disclosure, the integrated module can significantly improve the WPT efficiency and the WPT distance range by preventing the disturbance of the transmission and reception of the signal due to the conductor, condensing the magnetic flux toward the antennas and improving the characteristics of all of the various types of integrated antennas.

In addition, by minimizing the generation of the eddy current due to the magnetic field that can occur during the transmission and reception of the signal, it is possible to have remarkably excellent signal transmission/reception efficiency and transmission/reception distance range through prevention of magnetic loss. It is possible to prevent the function of the electronic parts from being lowered and the durability being reduced due to the heat caused by the eddy current or the malfunction by the electromagnetic interference of various signal processing circuit parts. It is also possible to minimize the influence of the magnetic field leakage on the health of the user of the portable device.

In addition, according to the present disclosure, even when the operating frequencies of heterogeneous antennas are distributed within a wide frequency band range from several tens of kHz to several tens of MHs, each of the antennas can give excellent functions. Thus, the present disclosure can be widely applied to various portable devices and electronic devices such as various mobile devices, smart household appliances, or Internet of Things devices.

BRIEF DESCRIPTION OF THE DRAWINGS

FIG. 4 is a view showing a case where dielectric is filled in a part of the gaps formed by a plurality of Fe-based alloy fragments included in the a magnetic field shielding layer, and FIG. 5 is a view showing a case where dielectric is filled up in all of the gaps.

FIG. 6 is a view showing a manufacturing process using a shredding device for shredding by unevenness provided in rollers, and FIG. 7 is a view showing a manufacturing process using a shredding device for shredding by metal balls provided on a support plate.

DETAILED DESCRIPTION OF THE EMBODIMENTS

Figure 1:
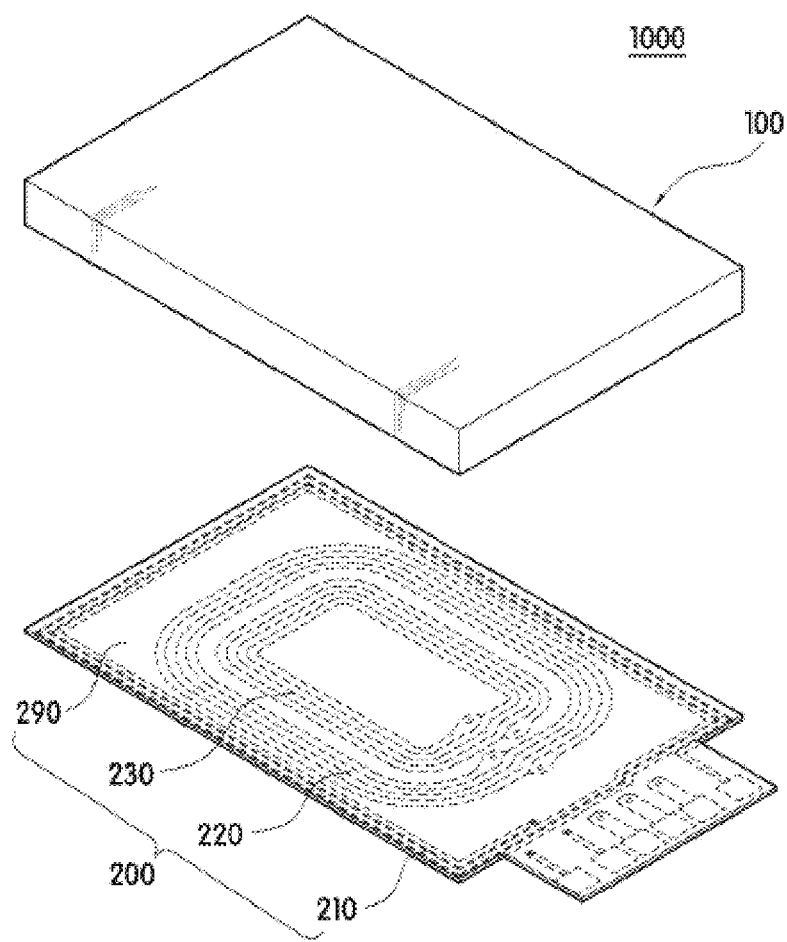
FIG. 1 is an exploded perspective view of an integrated module according to an embodiment of the present disclosure.

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

In an exemplary embodiment, as shown in FIG. 1, a multifunctional integrated module 1000 may include an antenna unit 200 including heterogeneous antennas 210, 220 and 230 and a magnetic field shielding unit 100 disposed on one surface of the antenna unit 200.

The antenna unit 200 may include heterogeneous antennas 210, 220, and 230.

Here, a plurality of the antennas provided in the antenna unit may be formed of a flat coil wound in a clockwise direction or counterclockwise direction. The wound flat coil may have a circular shape, an elliptical shape, a spiral shape, or a polygonal shape such as a quadrangular shape. The antenna may be a loop-shaped coil pattern which can be made by patterning a conductor such as a copper foil. The antenna may be formed at least one surface of a circuit board 290.

Each of the antenna types, sizes, materials, etc. may be designed differently according to the purpose. Also, the number of antennas included in the antenna unit 200 may be designed differently depending on the purpose. A single antenna may be provided for each function or application, or an antenna for a certain function, for example, a WPT operated at a different operating frequency, or in a WPT method such as a magnetic induction method or a magnetic resonance method. The present disclosure is not limited to the number of antennas.

In an exemplary embodiment, the heterogeneous antennas 210, 220, and 230 included in the embodiment of the present disclosure may be antennas having different frequency bands as their operating frequencies, or antennas having different functions. For example, the antennas may include at least two antennas having different operating frequencies among a first antenna having an operating frequency band of 5 kHz to 350 kHz, a second antenna having an operating frequency band including 6.78 MHz, and a third antenna having an operating frequency band including 13.56 MHz. In an exemplary embodiment, the heterogeneous antennas may include at least two types of antennas among a NFC antenna, a MST antenna, and a WPT antenna, so that the integrated module can have different functions.

The arrangement of the respective antennas will be described with reference to FIG. 1. Since the NFC antenna 210 has a frequency band higher than that of the WPT antenna 230, the NFC antenna 210 may have a rectangular shape with a fine line width along the outer periphery of the circuit board 290. The WPT antenna 230 may be formed with a line width wider than the line width of the NFC antenna 210 inside the NFC antenna 210 because power transmission is required and the lower frequency band is used than the NFC antenna 230. In addition, the MST antenna 220 using a lower frequency band than the NFC antenna 210 may be located between the NFC antenna 210 and the WPT antenna 230. The positional relationship between the antennas may be changed according to the purpose, and the number of antennas included in one circuit board 290 may also be changed.

The NFC antenna 210 may serve as a receiving antenna or a transmitting antenna that can transmit or receive data to enable file transmission, mobile payment, or the like, through signals transmitted or received. The specific material, shape, thickness, length, etc. of the NFC antenna 210 may be the same as those of an ordinary NFC antenna, and the present disclosure is not particularly limited thereto.

In an exemplary embodiment, the MST antenna 220 may serve as a receiving antenna or a transmitting antenna for transmitting or receiving data for electronic payment through a magnetic signal transmitted or received.

Figure 2:
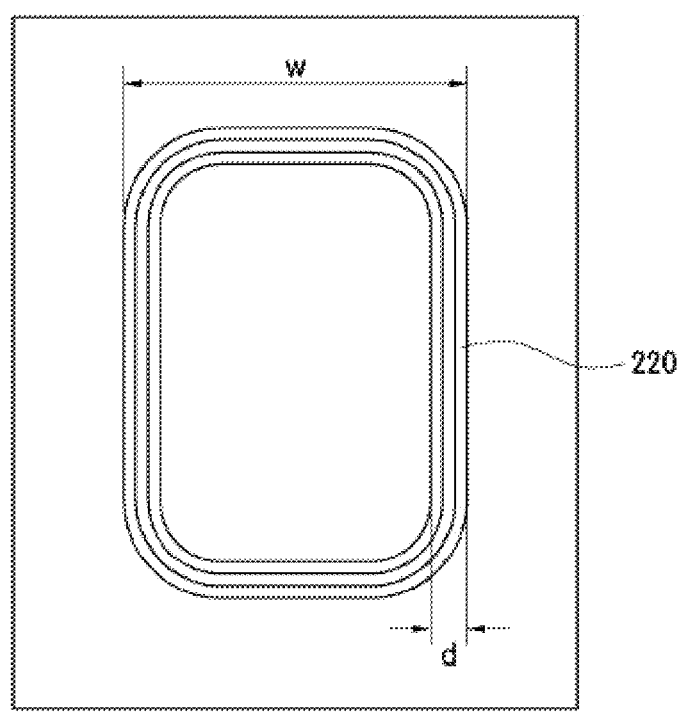
FIG. 2 is a plan view showing only the MST antenna among the antennas included in the antenna unit according to the embodiment of the present disclosure.

The MST antenna 220 may be formed of, for example, an inductor. The inductor may be a loop having at least one winding. Preferably, the loop may comprise more than 20 windings. For example, as shown in FIG. 2, the loop may have an outermost width w of 15 mm to 50 mm, and a width of the loop d formed by the loop may be 3 mm. Here, the loop may be formed such that an area formed by the loop is 600 mm$^2$ to 1700 mm$^2$.

Figure 3:
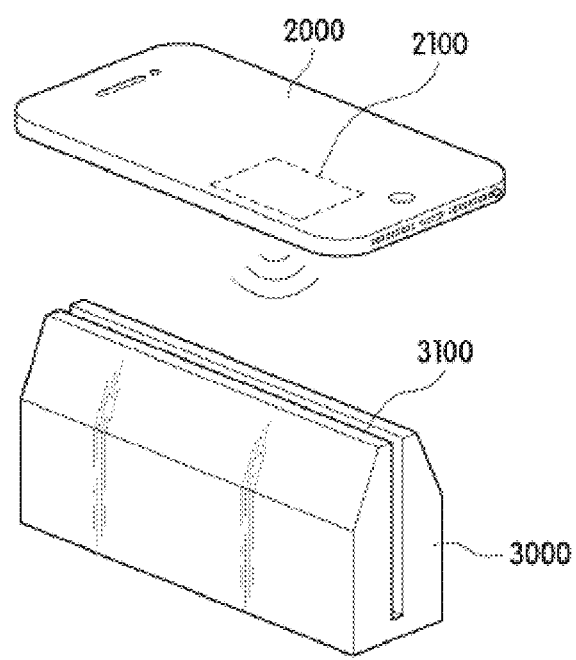
FIG. 3 is a diagram illustrating a state of use of a portable device having an integrated module including an MST antenna according to an embodiment of the present disclosure.

As shown in FIG. 3, the portable electronic device 2000 including the multifunctional integrated module 2100 having the MST antenna may be positioned at a predetermined distance from a POS terminal 3000. Even in that case, the inductor may be configured to form a magnetic field that diverges over a region corresponding to the sense opening 3100 of the magnetic reader head of the POS terminal 3000 such that the inductor may generate an omnidirectional magnetic field that can penetrate into a reader head (not shown) in the POS terminal 3000.

In an exemplary embodiment, the inductor may have an inductive capacity value that causes appropriately timed current pulses to reach their maximum value, thereby causing a maximum induced voltage in the reader header (not shown) in the POS terminal 3000. In addition, the inductor may have a sufficiently low resistance value to allow a large current required to generate a strong magnetic field. Therefore, the inductor may have a ratio of the inductive capacity to the resistance value of 10 µH/Ω to 80 µH/Ω.

In an exemplary embodiment, the inductor may be a material that is not saturated under the current flowing through the inductor.

In an exemplary embodiment, the WPT antenna 230 may serve as a receiving antenna or a transmitting antenna that can transmit power using a magnetic induction method or a magnetic resonance method through a wireless power signal transmitted or received. Since the charging technique using the magnetic induction method or the magnetic-resonance method is a known technique, a detailed description thereof will be omitted.

Meanwhile, when the antennas 210, 220, and 230 are formed on the circuit board 290, the circuit board 290 is a substrate that forms patterns and circuit parts of different types of antennas on its top surface. The circuit board 290 may be a material having heat resistance, pressure resistance, and flexibility. Considering the physical properties of such a material, a film such as polyimide (PI), polyethylene terephthalate (PET), which is a thermosetting polymer film, may be employed as the material of the circuit board 290.

In an exemplary embodiment, connecting terminals (not shown) for electrical connection with the circuit board 290 may be drawn out from both ends of the antenna unit 200.

The magnetic field shielding unit 100 disposed on one surface of the antenna unit 200 may improve the characteristics of the heterogeneous antennas 210, 220, and 230 included in the antenna unit 200, and condense the magnetic flux toward the antenna unit 200.

Figure 4:
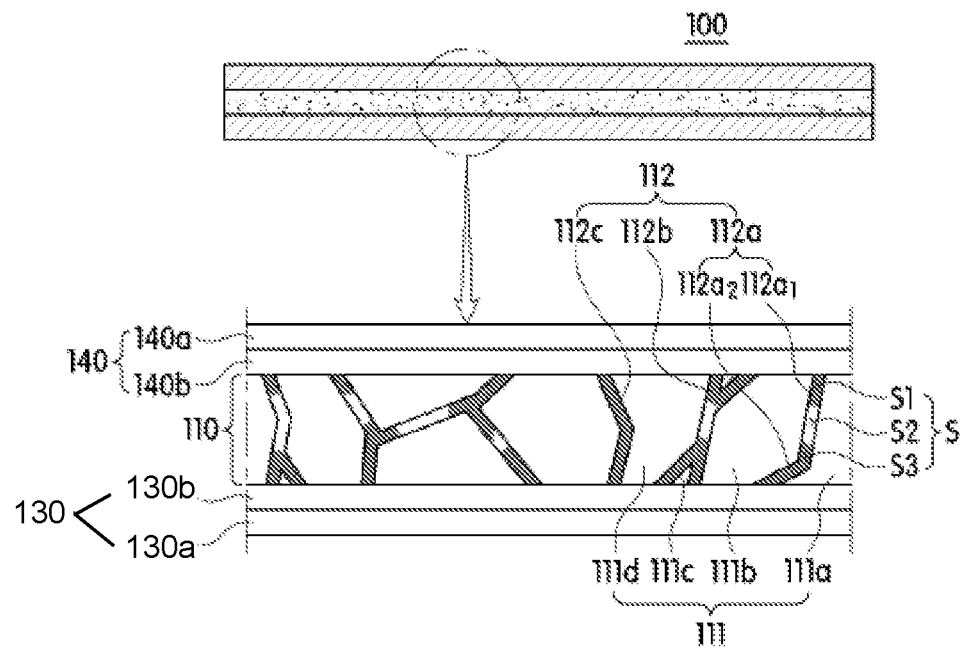
FIGS. 4 and 5 are enlarged cross-sectional views showing a magnetic field shielding unit according to an embodiment of the present disclosure.
Figure 5:
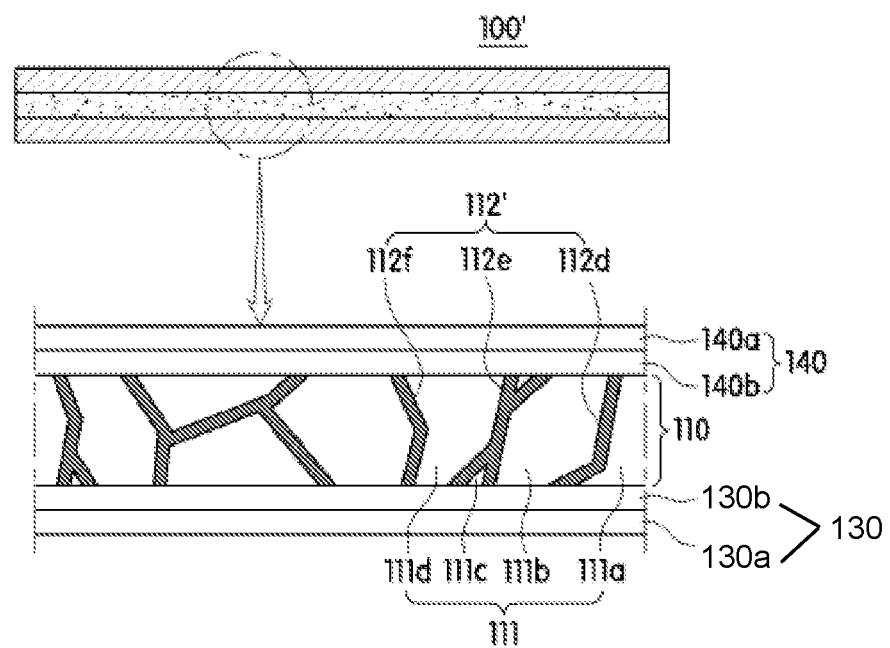

As shown in FIG. 4, the magnetic field shielding unit 100 for a WPT operable in the magnetic resonance method according to an embodiment of the present disclosure may include a magnetic field shielding layer 110. The magnetic field shielding layer 110 may include Fe-based alloy fragments 111 and dielectrics 112 which are filled in at least partial spaces S1 and/or S3 of all the gaps S between some adjacent ones of the Fe-based alloy fragments 111a and 111b. The magnetic field shielding unit 100 may further include a protective member 140 adhered to the top surface of the magnetic field shielding layer 110 through a first adhesive layer 140b and an adhesive member 130 adhered to the bottom surface of the magnetic field shielding layer 110. The adhesive member 130 may include a second adhesive layer 130b for adhering to the bottom surface of the magnetic field shielding layer 110 and a releasing film 150 for protecting the second adhesive layer 130b.

The magnetic field shielding layer 110 may be formed of fragments 111 of a shredded Fe-based amorphous alloy in order to improve the flexibility of the shielding unit and reduce eddy currents. As shown in FIG. 4, the magnetic field shielding layer 110 is formed of shredded Fe-based alloy fragments 111a, 111b, 111c, and 111d which may provide a significantly increased specific resistance of the magnetic field shielding layer 110 compared with a case that the magnetic field shielding layer 110 is formed in a single uniform shape, for example, the ribbon sheet, and thus can minimize the magnetic loss due to eddy currents. The specific resistance value may vary depending on the type of the magnetic material, and the magnetic material having a significantly larger specific resistance such as ferrite may be less susceptible to magnetic loss due to the eddy currents. On the other hand, the Fe-based alloy, which is a magnetic material according to the embodiment of the present disclosure, may have a small specific resistance and a large magnetic loss due to the eddy current. Thus, if the magnetic field shielding layer 110 is made in a form of ribbon sheet, it may be difficult to obtain a desired level of physical properties. However, the shredded Fe-based alloy fragments obtained by shredding the ribbon sheet may have a significantly increased specific resistance due to the gaps between the shredded fragments and the decreased magnetic loss due to the eddy current. Thus, the reduction of the permeability due to fragmentation and the reduction of the inductance of the radiator due to the reduction of the permeability may be compensated.

Meanwhile, the magnetic field shielding layer 110 formed of the shredded fragments 111 may have good flexibility. The Fe-based alloy, for example, the Fe-based alloy ribbon sheet may have a remarkably small elastic modulus and be strong in brittleness, and be easily fragmented or bent when an impact is applied to the ribbon sheet. Even when the ribbon sheet of the Fe-based alloy is manufactured so as to satisfy the initial design property (for example, permeability), there may be a problem of physical property change such that the physical property is significantly reduced compared with the initial physical property when the ribbon sheet is fragmented into multiple fine pieces. Therefore, if the magnetic field shielding layer which is not satisfying the initial design property is manufactured as a magnetic field shielding unit and is combined with a radiator, the desired WPT efficiency and transmission distance targeted at the initial designing may not be ensured. In particular, recent electronic devices which need a magnetic field shielding member are designed to be light and slim, so that the magnetic shielding unit is also required to be thinned. However, this problem becomes even more serious as the ribbon sheet of a thin thickness may be more easily broken.

However, the magnetic field shielding unit included in an embodiment of the present disclosure may be remarkably improved in flexibility. The reason is that the Fe-based alloy ribbon sheet is provided in a shredded and fragmented state at the beginning. Even if the thickness of the magnetic field shielding unit is thinned, the risk that cracks may be further generated in the Fe-based alloy fragments due to the external force can be blocked at its source. In addition, the Fe-based alloy may be provided in the magnetic field shielding unit in the fragmented state, and the initial physical property may be designed such that the magnetic field shielding unit including the ferrite in the fragmented state may exhibit excellent characteristics in the WPT of the magnetic resonance method from the beginning. Since the initial physical property value may be continuously maintained in the manufacturing step of the finished product to which the magnetic field shielding unit is installed and in the using stage of the finished product, it is possible to fundamentally eliminate deterioration of the physical property and significant reduction in the performance of power signal transmission and reception due to the deterioration due to unintentional fragmentation occurring in the magnetic field shielding unit having the ordinary non-shredded Fe-based alloy.

The Fe-based alloy may be a 3-element based alloy including iron (Fe), silicon (Si) and boron (B), or a 5-element based alloy including iron (Fe), silicon (Si), boron (B), copper (Cu), and niobium (Nb).

The 3-element based alloy may include silicon (Si) and boron (B) in addition to iron (Fe). Any other element such as chromium (Cr), cobalt (Co), or nickel (Ni) may be further added to the basic composition of the 3-element based alloy, to improve other characteristics, for example, the characteristic of corrosion resistance. When the Fe-based alloy is a Fe—Si—B-based alloy, it may be an alloy containing 70 at % to 90 at % of Fe. When the content of Fe is increased, the saturation magnetic flux density of the alloy may be increased, while a crystalline alloy may be produced. Further, the Si and B elements have a function of raising the crystallization temperature of the alloy and make the alloy more amorphous. For the content of the Si and B elements, Si may be 10 at % to 27 at % and B may be 3 at % to 12 at %, but the present disclosure is not limited thereto and may be changed depending on the degree of the desired properties.

The 5-element based alloy may include iron (Fe), copper (Cu), niobium (Nb) silicon (Si) and boron (B). The copper may improve the corrosion resistance of the Fe-based alloy, prevent the size of the crystal from becoming larger even when crystals are generated, and improve magnetic properties such as magnetic permeability.

The copper is preferably contained in an amount of 0.01 at % to 10 at % in the alloy. If copper content is less than 0.01 at %, the effect obtained by copper may be insignificant. If the copper content exceeds 10 at %, an amorphous alloy may not be produced.

In addition, the niobium (Nb) may improve magnetic properties such as magnetic permeability. It is preferable that Nb is contained in the alloy in an amount of 0.01 at % to 10 at %. If the amount of Nb is less than 0.01 at %, the effect obtained by niobium may be insignificant. If the amount of Nb exceeds 10 at %, it may be difficult to produce an amorphous alloy.

When the Fe-based alloy is a five-element alloy by further including Si and B, Si and B may be contained in the alloy in an amount of 10 at % to 30 at % and Fe may be contained as the balance. When the content of Fe is increased, the saturation magnetic flux density of the alloy may be increased, but on the contrary, a crystalline alloy may be produced. Further, the content of Si and B may increase the crystallization temperature of the alloy and make the alloy more amorphous. For the content of Si and B, Si may be 10 at % to 27 at % and B may be 3 at % to 12 at %, but it is not limited thereto and may be changed depending on the desired properties.

The Fe-based alloy fragments may originate from a Fe-based amorphous alloy ribbon, and may be heat-treated to control the desired permeability. The heat-treated Fe-based alloy may include an amorphous crystalline shape or nanocrystal grains. The crystalline shape of the Fe-based alloy may vary depending on the composition of the alloy, the composition ratio, and/or the heat treatment temperature/time.

On the other hand, with respect to the magnetic permeability of the Fe-based alloy, the magnetic material included in the conventional magnetic shielding material is advantageous for shielding the magnetic field as the magnetic permeability is higher. The relationship between the permeability of the magnetic material and the characteristics of the radiator may not be regarded as a simple proportional relationship. Accordingly, even if the permeability is too high, it may not be possible to achieve the desired level of radiator characteristics for WPT. More specifically, when any one magnetic material having a high magnetic permeability is combined with the radiator for WPT, the magnetic material may improve the inductance characteristics of the radiator or can make the increase of the specific resistance characteristics of the radiator larger than the increase of inductance characteristic. In this case, the characteristics of the radiator may be lowered or the degree of improvement of the radiator characteristics may be small compared to when the magnetic field shielding unit having a low magnetic permeability is combined with the radiator for WPT. Accordingly, it is preferable that the magnetic field shielding layer may be provided with a Fe-based alloy having an appropriate permeability so as to improve the inductance of the radiator and to minimize the increase of the specific resistance when the magnetic-field shielding unit is combined with the radiator. The permeability of the magnetic shielding layer after shredding may be 100 to 1300, more preferably 100 to 700. However, since the temperature and the heat treatment time may be different depending on the specific composition ratio of the Fe-based alloy and the desired permeability. Therefore, the temperature and time in the heat treatment process for the Fe-based alloy ribbon may not be particularly limited thereto.

Further, the Fe-based alloy fragments may have an irregular shape as a single fragment. Further, when one corner of the Fe-based alloy fragments is curved, or one side is curved, the magnetic field shielding layer including the fragments having such a shape may increase flexibility. There is an advantage that additional fine fragmentation may be prevented even when an external force is applied to the magnetic field shielding unit.

The particle diameter of the Fe-alloy fragments may be 1 μm to 5 mm, preferably 1 μm to 1000 μm. The particle diameter of the Fe-alloy fragments may refer to the particle diameter measured through an optical microscope, which means the longest distance from one point to the other point on the surface of the fragment. Here, in the particle diameter distribution of the Fe-based alloy fragments, the number of fragments having a particle diameter of less than 500 μm may be 40% or more, more preferably 60% or more, and even more preferably 80% or more of the total number of fragments. If the number of fragments having a particle diameter of less than 500 μm is less than 40% of the total number of fragments, the Fe-based alloy has a high permeability, and even if it induces the improvement of the inductance characteristic of the radiator, the specific resistance property of the radiator may be further increased. The degree of improvement of the radiator characteristics may be very small, and a heat generation problem due to the eddy current may occur, or a performance of the magnetic field shielding unit may be deteriorated due to a magnetic leakage. Particularly, additional fine fragmentation of the Fe-based alloy due to an external force may be caused, which may lead to a changing or a decreasing in designed physical properties.

More preferably, among the Fe-based alloy fragments 111 included in the magnetic field shielding layer 110, the portion of the Fe-based alloy fragments 111 of which the particle diameter is less than 50 μm may be less than 50% of the total number of the Fe-based alloy fragments 111. When the fine fragments having a particle diameter of less than 50 μm are contained in an amount of 50% or more, there is an advantage in improving the flexibility of the magnetic field shielding unit and in reducing the eddy current. However, the magnetic characteristics of the magnetic field shielding unit itself may be deteriorated and the radiator characteristics may be deteriorated accordingly.

Next, a description will be given with respect to the dielectric 112 which is filled in at least a part of gaps between the adjacent fragments 111a/111b and 111b/111d among the above-mentioned Fe-based alloy fragments 111.

The dielectric 112 may further minimize eddy currents generated by partially or totally insulating adjacent Fe-based alloy fragments, and prevent the fractured Fe-based alloy fragments 111 from moving within the magnetic field shielding layer 110 by holding and supporting the Fe-based alloy fragments. In addition, the dielectric 112 may function to prevent the amorphous alloy from being oxidized by moisture penetration. The dielectric 112 may further function as a shock absorber to prevent the fragments 111 from being additionally broken or fragmented when an external force is applied to the magnetic field shielding layer.

As shown in FIG. 1, the dielectrics 112a1 and 112a2 may be filled in the partial spaces S1 and S3 out of gaps S1, S2 and S3 between the first Fe-based alloy fragment 111a and the second Fe-based alloy fragment 111b. The partial space S2 of the gaps may remain in an empty space without being filled with the dielectric 112, thereby partially insulating the Fe-based alloy fragment.

On the other hand, as shown in FIG. 2, the dielectric 112' may be filled in all of the gaps between adjacent fragments 111a to 111d to insulate all of the Fe-based alloy fragments.

The material of the dielectric 112 and 112' may be a material that is commonly known as a dielectric, and a material having adhesiveness in terms of fixing the Fe-based alloy fragments. The material having such physical property can be used without limitation. As a non-limiting example, the dielectric 112 and 112' may be a composition that is formed by hardening the dielectric forming composition, by cooling after melting by heat, or by exhibiting an adhesive force at room temperature under pressure. As an example of a composition that is hardened to form a dielectric, the dielectric forming composition may include at least one of a thermoplastic resin and a thermosetting resin, and may include a hardening agent. In addition, the dielectric forming composition may further include a hardening accelerator and a solvent.

Specifically, the thermoplastic resin may be at least one selected from the group consisting of polyethylene, polypropylene, polystyrene, polyvinyl chloride, acrylonitrile-butadiene-styrene resin (ABS), acrylonitrile-styrene resin (AN), acrylic resin, methacrylic resin, polyamide, polyethylene terephthalate (PET), polybutylene terephthalate (PBT), phenoxy resin, polyurethane resin, nitrile butadiene resin, and the like.

The thermosetting resin may include at least one of a phenol resin (PE), a urea resin (UF), a melamine resin (MF), an unsaturated polyester resin (UP) and an epoxy resin and the like, preferably, may be an epoxy resin. Examples of the epoxy resin may include multifunctional epoxy resin such as bisphenol A type, bisphenol F type, bisphenol S type, canceled bisphenol A type, hydrogenated bisphenol A type, bisphenol AF type, biphenyl type, naphthalene type, fluorene type, phenol novolak type, novolak type, trishydroxylphenylmethane type, tetraphenylmethane type and the like which may be used alone or in combination.

When the thermosetting resin is used in combination with a thermoplastic resin, the content of the thermosetting resin may be 5 to 95 parts by weight per 100 parts by weight of the thermoplastic resin.

The hardening agent may be used without any particular limitation as long as it is a known one. As a non-limiting example, amine compound, phenol resin, acid anhydride, imidazole compound, polyamine compound, hydrazide compound, dicyandiamide compound, etc. may be used alone or in combination of two or more. The hardening agent may be preferably composed of at least one material selected from an aromatic amine compound hardening agent and a phenol resin hardening agent. The aromatic amine compound hardening agent or the phenolic resin hardening agent may have the advantage of less change in adhesion property even when stored at room temperature for a long period of time. Examples of the aromatic amine compound hardening agent may include m-xylene diamine, m-phenylenediamine, diaminodiphenylmethane, diaminodiphenylsulfone, diaminodearyl diphenylmethane, diaminodiphenyl ether, 1,3-bis [(4-aminophenoxy) phenyl] sulfone, 4,4'-bis (4-aminophenoxy)-aminophenoxy) biphenyl, 1,4-bis (4-aminophenoxy) benzene, and the like, which may be used alone or in combination. Examples of the phenol resin hardening agent may include phenol novolac resin, cresol novolak resin, bisphenol-A novolak resin, phenol aralkyl resin, poly-p-vinylphenol t-butylphenol novolac resin, and naphthol novolak resin, which may be used alone or in combination. The content of the hardening agent may be preferably 20 to 60 parts by weight per 100 parts by weight of at least one of the thermoplastic resin and the thermoplastic resin. When the content of the hardening agent is less than 10 parts by weight, the effect of hardening on the thermosetting resin may be insufficient and the heat resistance may be lowered. On the other hand, when the content of the hardening exceeds 60 parts by weight, the reactivity with the thermosetting resin may be high, and the physical properties such as handling and long-term storage of the magnetic field shielding unit may be deteriorated.

The hardening accelerator may be selected depending on the specific kind of the thermosetting resin and the hardening agent. In the present disclosure, there may be no particular limitation thereto. As a non-limiting example, the hardening accelerator may include amine-based, imidazole-based, phosphorus-based, boron-based, and phosphorus-boron-based ones, which may be used alone or in combination. The content of the hardening accelerator may be preferably about 0.1 to 10 parts by weight, and more preferably 0.5 to 5 parts by weight per 100 parts by weight of at least one of the thermoplastic resin and the thermoplastic resin.

The dielectrics 112 and 112' formed through the above-described dielectric composition may be formed by permeating a part of at least one of the first adhesive layer 140b and the second adhesive layer 130b, described later, into the gaps between the Fe-based alloy fragments. The composition of the dielectric 112 and 112' and the composition of at least one of the first adhesive layer 140b and the second adhesive layer 130b may be the same.

The thickness of the magnetic field shielding layer 110 including the above-described Fe-based alloy fragments 111 and the dielectric 112 may be the thickness of the Fe-based amorphous alloy ribbon which is the origin of the above-mentioned Fe-based alloy fragments. Except for the gaps between fragments and the thickness of the dielectric covering the top or bottom of some fragments, the thickness of one layer of the magnetic field shielding layer 110 may be 15 μm to 35 μm, but is not limited thereto.

The shape of the magnetic field shielding layer may be a circle, an ellipse, a polygonal shape such as a pentagon, etc. as well as a rectangular shape or a square shape, or a shape in which a curved line and a straight line are partly mixed, so as to correspond to the shape of the application to which the magnetic field shielding unit is applied. For example, the shape of the magnetic field shielding layer may have the same shape (Ex. Ring shape) corresponding to the shape of the radiator. Here, it is preferable that the size of the magnetic field shielding unit may be about 1 mm to 2 mm larger than that of the radiator.

As shown in FIG. 1 or 2, the protective member 140 including a base film 140a and a first adhesive layer 140b formed on one surface of the base film 140a may be formed on the top surface of the magnetic field shielding layer 110 or 110'. The adhesive member 130 may be provided on the bottom surface of the magnetic field shielding layer 110 or 110'.

First, the base film 140a of the protective member 140 may be a protective film typically provided in the magnetic field shielding unit. The base film 140a needs to have heat resistance enough to withstand the heat/pressure applied for hardening in the step of attaching the magnetic field shielding sheet to a substrate having the radiator. In addition, the base film 140a also needs to have mechanical strength and chemical resistance sufficient to protect the magnetic field shielding layer 110 or 110' against external physical and chemical stimuli. Any film which can meet such characteristics may be used without limitation. As non-limiting examples, the raw material of the base film 140a of the protective member 140 may include polyethylene, polypropylene, polyimide, crosslinked polypropylene, nylon, polyurethane resin, acetate, polybenzimidazole, polyimideamide, polyetherimide, polyphenylene sulfide (PPS), polyethylene terephthalate (PET), polytrimethylene terephthalate (PTT), polybutylene terephthalate (PBT), polyvinylidene fluoride (PVDF), polytetrafluoroethylene (PTFE), polychlorotrifluoroethylene (PCTFE), and polyethylene tetrafluoroethylene (ETFE) and the like, which may be used alone or in combination.

The base film 140a may have a thickness of 1 μm to 100 μm, preferably 10 μm to 30 μm, but is not limited thereto.

The protective member 140 may include the first adhesive layer 140b on one surface of the base film 140a. The protective member 140 may be adhered to the magnetic field shielding layer 110 through the first adhesive layer 140b. The first adhesive layer 140b may be used without limitation in case that it is a typical adhesive layer. Preferably, the first adhesive layer 140b may be the dielectric forming composition as described above, may minimize the generation of eddy currents accordingly. The first adhesive layer 140b may have an improved adhesive force by increasing the compatibility with the dielectric 112 provided in the magnetic field shielding layer 110. Accordingly, the composition of the dielectric 112 and the composition of the first adhesive layer 140b may be the same, but are not limited thereto. The thickness of the first adhesive layer 140b may be in the range of 3 μm to 50 μm, but is not limited thereto and may be changed according to the purpose of use.

Next, the adhesive member 130 may function to attach the magnetic field shielding unit 100 or 100' to the antenna unit 200. As shown in FIG. 4, the adhesive member 130 may include a second adhesive layer 130b. The adhesive member 130 may further include a releasing film 130a for protecting the second adhesive layer 130b prior to being attached to the antenna unit 200.

The second adhesive layer 130b may be formed by applying an adhesive composition to the bottom surface of the magnetic field shielding layer 110 or 110'. The second adhesive layer 130b formed by applying an adhesive composition on the releasing film 130a may be attached to the magnetic field shielding layer 110 or 110'. Alternatively, the second adhesive layer 130b may be a double-sided adhesive member coated with an adhesive agent on both sides of the film-like supporting substrate for reinforcement of mechanical strength. The adhesive layer formed on the top surface of the support substrate may be attached to the bottom surface of the magnetic shielding layer 110 or 110'. The releasing film 130a may be adhered to the one adhesive layer formed on the bottom surface of the supporting substrate.

In addition, the second adhesive layer 130b may permeate into the gaps between adjacent Fe-based alloy fragments existing on the inner side of the magnetic field shielding layer from the one surface of the attached magnetic field shielding layer, thereby partially or wholly insulating the Fe-based alloy fragments. The second adhesive layer 130b may be derived from the dielectric 112 or 112' described above, and thus the adhesive composition for forming the second adhesive layer 130b may be the dielectric forming composition described above. On the other hand, even if the second adhesive layer 130b is not derived from the dielectric 112 or 112' described above, the composition for forming the second adhesive layer 130b may be the same as the dielectric forming composition in order to improve the adhesive strength by increasing the compatibility between the second adhesive layer 130b and the dielectric 112 or 112' provided in the magnetic field shielding layer, but it is not limited thereto and may be a different composition.

The magnetic field shielding unit according to an embodiment of the present disclosure may be manufactured by a manufacturing method described below, but the present disclosure is not limited thereto.

First, step (a) of preparing a heat-treated Fe-based alloy ribbon may be performed. The Fe-based alloy ribbon may be manufactured by a known method such as rapid solidification process (RSP) by melt spinning. The manufactured Fe-based alloy ribbon may be subjected to a heat treatment process to adjust the permeability after cutting so as to have a predetermined width. The heat treatment temperature may be selected depending on the composition of the Fe-based alloy, the composition ratio, and the degree of the magnetic permeability of the desired to amorphous alloy. In order to exhibit excellent physical properties over a predetermined level within a desired operating frequency range, the heat treatment may be performed with respect to the Fe-based alloy ribbon at a temperature of 300° C. to 600° C., more preferably 400° C. to 500° C., and more further preferably 440° C. to 480° C. for 30 minutes to 2 hours in an air atmosphere or a nitrogen atmosphere. If the heat treatment temperature is less than 300° C., the permeability may be too low or too high compared to the desired permeability level, which may make it difficult to be shredded into fragments due to weak fragility and the heat treatment time may be prolonged. Also, when the heat treatment temperature exceeds 600° C., the permeability may be significantly lowered.

Next, step (b) of forming the dielectric in gaps between the Fe-based alloy fragments produced by shredding the Fe-based alloy ribbon may be performed.

First, in one embodiment of the step (b), a protective member having the first adhesive layer may be adhered to one surface of the Fe-based alloy ribbon and an adhesive member having the second adhesive layer may be adhered to the other surface of the Fe-based alloy ribbon, which can provide a laminate. The laminate may be passed through the shredding device so that the Fe-based alloy ribbon may be shredded into irregular shaped fragments. Thereafter, pressure may be applied to the laminate to permeate the first adhesive layer and the second adhesive layer into the gaps between the Fe-based alloy fragments to fix and support the fragments. At the same time, the fragments may be insulated from each other to significantly reduce the generation of eddy currents and block the penetration of moisture, thereby preventing the amorphous alloy from being oxidized. The method of applying the pressure to the laminate may be carried out in such a manner that pressure is applied to the laminate together with shredding in the shredder device. Alternatively, after the laminate is shredded, a separate pressing process may be further performed to increase the degree of permeation of the first adhesive layer and the second adhesive layer.

Figure 6:
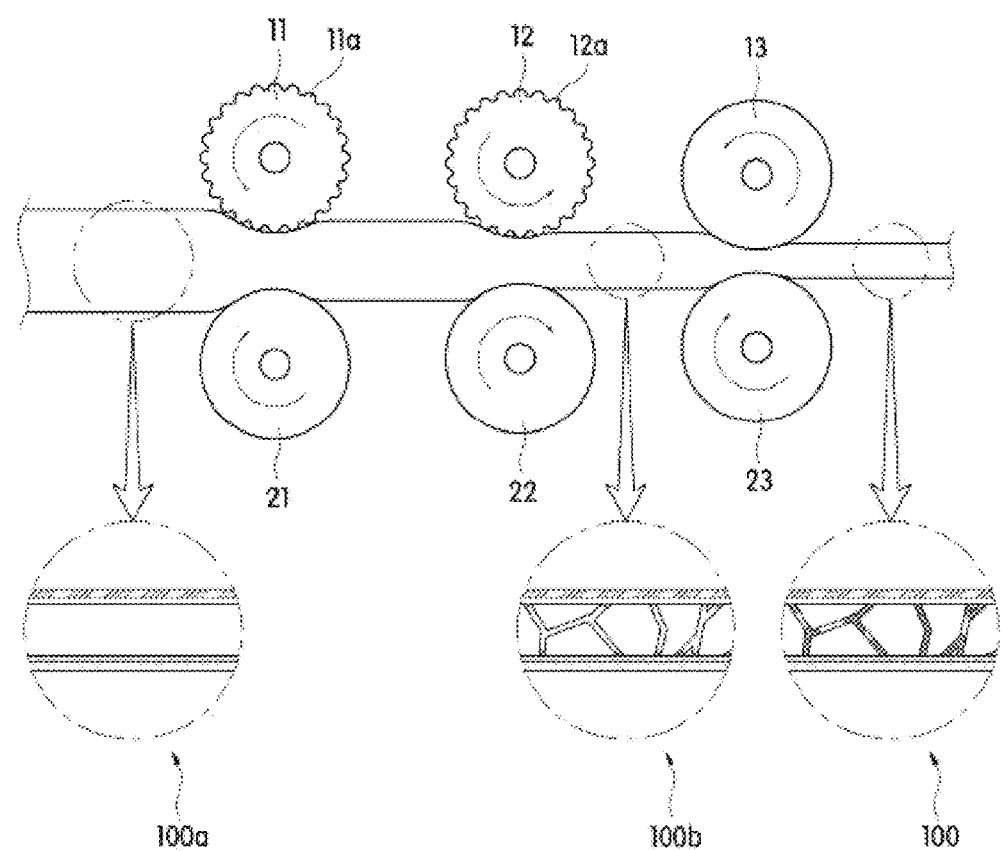
FIGS. 6 and 7 are schematic views of a manufacturing process using a shredding device for manufacturing the magnetic field shielding unit according to an embodiment of the present disclosure. In detail.

Specifically, as shown in FIG. 6, the laminate 100a may be shredded and pressurized by passing through the shredding device which includes a plurality of first rollers 11 and 12 having unevenness 11a and 12a and second rollers 21 and 22 corresponding to the first rollers 11 and 12, respectively. The magnetic field shielding unit 100 may be produced by further pressing the shredded laminate 100b through a third roller 13 and a fourth roller 23 corresponding to the third roller 13.

Figure 7:
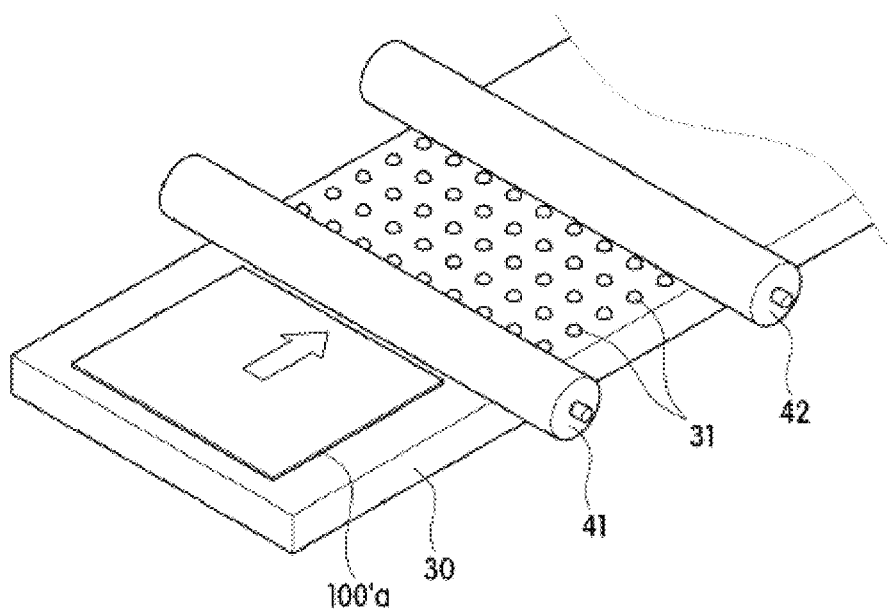
Figure 8:
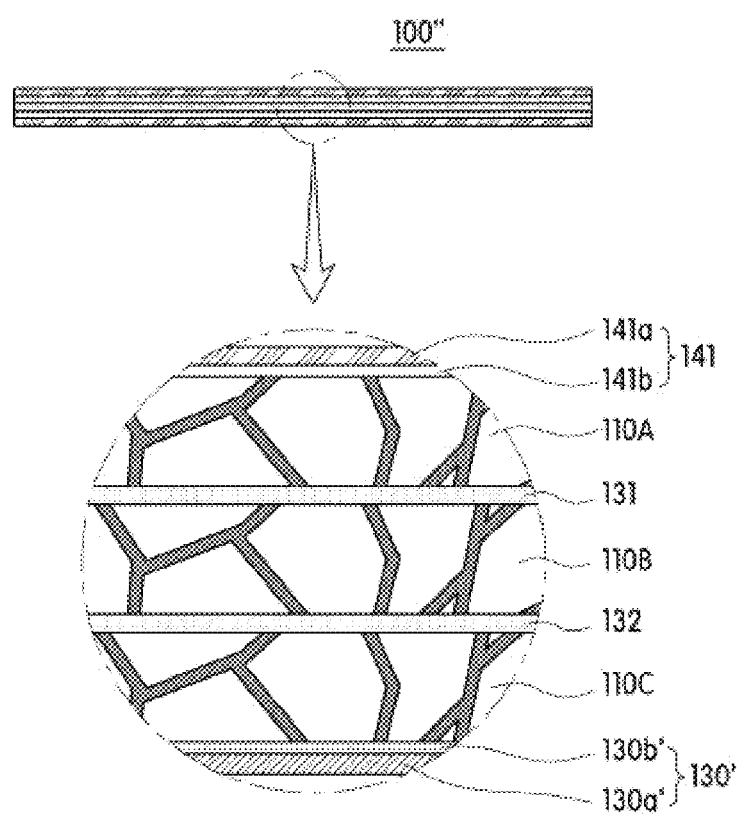
FIG. 8 is a cross-sectional view of a magnetic field shielding unit according to an embodiment of the present disclosure having three magnetic field shielding layers including Fe-based alloy fragments.

As shown in FIG. 7, the laminate 100a including the Fe-based alloy ribbon sheet may be fed into the shredding device which is provided with a support plate 30 having a plurality of metal balls 31 on one surface thereof and rollers 41 and 42 disposed on the upper portion of the support plate 30 for moving the Fe-based alloy ribbon sheet to be shredded. Pressure may be applied through the metal ball 31 to shred the ribbon sheet. The shape of the metal ball 31 may be spherical, but is not limited thereto, may be a triangle, a polygon, an ellipse, or the like. The shape of the metal ball 31 formed on the first roller may be one shape or a mixture of various shapes Meanwhile, as shown in FIG. 8, a plurality of magnetic shielding layers 110A, 110B and 110C may be provided in the magnetic field shielding unit 100''. Dielectric layers 131 and 132 for reducing eddy currents may be interposed between adjacent magnetic field shielding layers 110A/110B and 110B/110C.

In some cases, when the magnetic field shielding unit is implemented by providing only a single magnetic field shielding layer, the magnetic shielding layer may not meet a level of physical properties suitable for functions such as WPT or NFC and/or MST. Accordingly, the magnetic field shielding unit according to an embodiment of the present disclosure may include a plurality of magnetic field shielding layers. By doing so, it is possible to achieve the same effect of increasing the physical properties as using a magnetic material having a high magnetic permeability. The magnetic field shielding unit with the laminated magnetic field shielding layers further improves the inductance of the heterogeneous antennas 210, 220, 230 while increasing the resistivity relatively less. Accordingly, the antennas 210, 220, and 230 can exhibit a high quality index.

When a plurality of magnetic field shielding layers are provided in the magnetic field shielding unit, it is preferable that the number of magnetic field shielding layer may include 2 to 10 layers, but is not limited thereto. On the other hand, even increasing the number of laminating of the magnetic field shielding layers infinitely, the desired level of physical properties may not be achieved. If the number of laminating of the magnetic field shielding layer exceeds 10, the degree of increase of the specific resistance is significantly greater than the degree of increase of the inductance of the antennas 210, 220, and 230, so that improvement of the quality index of the antennas 210, 220, and 230 may be minimal. Further, its thickness may become thicker, which may be undesirable in reducing the thickness of the magnetic field shielding unit.

In the meantime, when a plurality of magnetic shielding layers 110A, 110B and 110C are provided, dielectric layers 131 and 132 may be interposed between adjacent magnetic shielding layers 110A/110B and 110B/110C to reduce eddy currents. The dielectric layers 131 and 132 may be an insulating adhesive layer. Here, the insulating adhesive layer may be formed using the dielectric forming composition described above. Specifically, a plurality of Fe-based alloy ribbon may be laminated via the insulating adhesive layers 131 and 132 and then the ribbon may be shredded to form a magnetic field shielding unit 100 having a plurality of magnetic field shielding layers 110A, 110B and 110C. In this case, the dielectric included in the upper portion of the second magnetic shielding layer 110B and the lower portion of the first magnetic shielding layer 110A adjacent to the second magnetic shielding layer 110B may be formed by permeating the insulating adhesive layer 131 interposed between the two magnetic field shielding layers 110A and 110B into the gaps between Fe-based fragments disposed on the lower portion of the first magnetic field shielding layer 110A and on the upper portion of the second magnetic field shielding layer 110B. Preferably, the thickness of the insulating adhesive layers 131 and 132 may be larger or the same as that of the first adhesive layer 130b of the protective member 130b and/or that of the second adhesion layer 140b of the adhesive member 140b both of which are provided on the upper portion and the lower portion of the laminated magnetic field shielding layers 110A, 110B and 110C, respectively, but is not limited thereto.

In another embodiment, the dielectric layers 131 and 132 may be a heat-radiating adhesive layer. The heat radiating adhesive layer may be formed by mixing a known heat radiating filler such as nickel, silver, or carbon with an adhesive component such as acrylic, urethane, epoxy or the like. Since the specific composition and content can be determined according to known composition and content, it is not particularly limited in the present disclosure.

When a plurality of the magnetic shielding layers 110A, 110B, and 110C are provided, the composition of the Fe-based amorphous alloy included in each of the magnetic field shielding layers may be the same or different. The compositions of the Fe-based amorphous alloys may be the same or different. Also, even though the composition is the same, the magnetic permeability of each of the magnetic shielding layers may be different due to the difference in the heat treatment time and the like. The thickness of each of the magnetic shielding layers may be the same or different depending on the purpose.

Specifically, a functional layer such as an electromagnetic wave shielding layer, a heat radiating layer, and/or a composite layer in which these are stacked or a composite layer in which these layers are combined as a single layer may be provided on the upper portion of the protective member 130 of the magnetic field shielding layer 100 and/or on lower portion of the adhesive member 140. For example, a metal foil such as copper, aluminum, or the like, which is excellent in thermal conductivity and conductivity, may be attached to the upper portion of the protective member 130 through an adhesive agent or a double-sided tape. Or, Cu, Ni, Ag, Al, Au, Sn, Zn, Mn, Mg, Cr, Tw, Ti or the combination of these metals may be formed on the protective member 130 by a known method such as sputtering, vacuum deposition, chemical vapor deposition, or the like to form a metal thin film. When the functional layer is provided through an adhesive agent, the adhesive agent may be a known adhesive agent. As a non-limiting example, acrylic-based, urethane-based or epoxy-based adhesives may be used. On the other hand, a heat radiating function may be added to the above adhesive agent. For this purpose, a known filler such as nickel, silver or carbon material may be mixed with the adhesive agent. The content of the filler may be such that the adhesive agent performance of the adhesive agent may not be deteriorated and the heat radiating performance can be exhibited. But the filler is not particularly limited thereto. In addition, the thickness of the functional layer may be in the range of 5 μm to 100 μm, and more preferably 10 μm to 20 μm in order to reduce the thickness of the magnetic field shielding unit.

The Embodiments of Present Disclosure

The present disclosure will now be described more specifically with reference to the following embodiment of exemplary examples. However, the following the embodiment of exemplary examples should not be construed as limiting the scope of the present disclosure, and should be construed to facilitate understanding of the present disclosure.

<Exemplary Embodiment 1>

Figure 9:
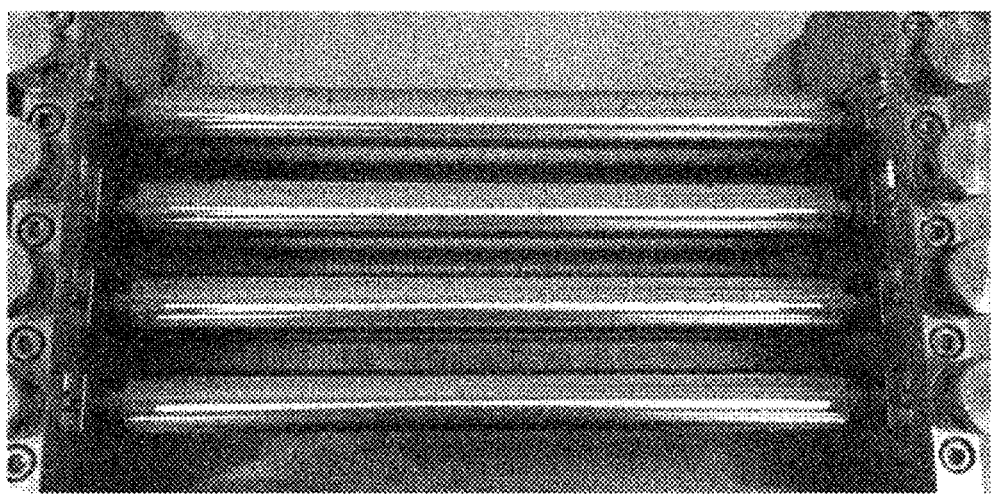
FIG. 9 is a picture showing a top view of the shredding device according to FIG. 7 used in manufacturing the magnetic field shielding unit according to the embodiment of the present disclosure.

After manufacturing a $Fe_{91.6}Si_2B_6Co_{0.2}Ni_{0.2}$ amorphous alloy ribbon by the rapid solidification process (RSP) through melt spinning, a ribbon sheet having a thickness of 24 μm cut into a sheet shape was heat-treated without magnetic field at 610° C. in an atmosphere for 1 hour. A double-sided tape (support base PET, KYWON CORPORATION, VT-8210C), which includes a releasing film adhered to a surface thereof, having a thickness of 10 μm was laminated on one surface of the ribbon sheet. Thereafter, a PET protective member (International Latex, KJ-0714) having a thickness of 7 μm and an adhesive layer formed on one surface thereof was laminated on the other surface of the ribbon sheet. As shown in FIGS. 7 and 9, the obtained laminate passed through the shredded device three times to manufacture a magnetic field shielding unit as shown in Table 1 below.

Then, after removing the releasing film of the magnetic field shielding unit, the exposed double-sided tape was applied to an antenna unit having the specifications as described below, which was provided on one circuit board with the NFC antenna, the MST antenna, and the WPT antenna, to manufacture a multifunctional integrated module as shown in Table 1 below.

Antenna Unit

As shown in FIG. 1, the NFC antenna 210, the MST antenna 220, and the WPT antenna 230 are implemented on both sides of the flexible printed circuit board (FPCB) 29Q with a copper foil having a thickness of 50 μm.

The NFC antenna 210 was formed by turning four times a copper foil having a thickness of 50 μm so as to be 53 mm×63 mm on the inside and 59 mm×65 mm on the outside. Its voltage standing wave ratio (VSWR) was 1.5 and the resonance frequency was 13.56 MHz.

The MST antenna 220 was manufactured by turning the copper foil having a thickness of 50 μm 10 times to have an inner dimension of 41 mm×45 mm and an outer dimension of 47 mm×58 mm. The MST antenna 220 has an inductance Ls of 15.47 μH at the frequency of 10 kHz, and a resistivity Rs of 1.27Ω.

Unlike that shown in FIG. 1, the WPT antenna 230 was manufactured by turning the copper foil having a thickness of 50 μm 11 times to be a circular shape that has an inner diameter of 23 mm and an outer diameter of 43 mm. Its inductance Ls was 8.8 μH at the frequency of 200 kHz, and the resistivity Rs was 0.589Ω.

<Exemplary Embodiments 2 to 6>

The magnetic field shielding unit was manufactured in the same manner as in exemplary embodiment 1 except that the number of shredding was changed as shown in Table 1 to prepare a multifunctional integrated module as shown in Table 1 below.

<Exemplary Embodiment 7>

The Fe73.5Si13.5B9Cu1Nb3 amorphous alloy ribbon was prepared, in the same manner as in exemplary embodiment 1, by the RSP by melt spinning instead of the Fe91.6Si2B6Co0.2Ni0.2 amorphous alloy ribbon. Thereafter, the amorphous alloy ribbon was cut into one ribbon sheet having a thickness of 24 μm and the ribbon sheet was subjected to a heat treatment without magnetic field at 610° C. in an N2 atmosphere for 1 hour. The heat-treated ribbon sheet was shredded to obtain the magnetic field shielding unit, and then the multifunctional integrated module as shown in Table 1 was manufactured using the magnetic field shielding unit.

<Comparative Example 1>

The multifunctional integrated module as shown in Table 1 was manufactured in the same manner as in exemplary embodiment 1 except that the antenna unit was used without a magnetic field shielding unit <Experimental Example 1>

The particle diameter size distribution of the fragments was analyzed for the magnetic field shielding unit prepared in the exemplary embodiments and comparative Example by the following method, and the results are shown in Table 1.

Specifically, After peeling the adhesive protective film provided on one surface of each of five specimens of the magnetic field shielding unit of 10 mm×10 mm in width and length, the particle diameter sizes of the fragments were measured with an optical microscope to count the number of fragments having a particle diameter size of less than 500 μm and the number of fragments having a particle diameter size of less than 50 μm. Then, the number of fragments having a particle diameter size of less than 500 μm, the number of fragments having a particle diameter size of less than 50 μm, and the total number of fragments were counted. The ratio of fragments having a particle diameter size of less than 500 μm and the ratio of fragments having a particle diameter size of less than 50 μm were calculated in relation to the total number of fragments. Finally, an average ratio of fragments of the five specimens was calculated.

<Experimental Example 2>

The following properties of the multifunctional integrated module according to in the exemplary embodiments and the comparative Example were evaluated and are shown in Table 1 below.

1. Wireless Power Signal Transmission Efficiency

A 200 kHz sinusoidal signal was amplified and input to the wireless power transmitting antenna provided in the wireless power signal transmission module, and a integrated module having a load resistance of 50Ω connected to the output terminal of the wireless power receiving antenna was aligned. In this state, the electric power transmission efficiency was measured by measuring the current generated through the wireless power receiving antenna through an oscilloscope. As a result of the measurement, the power transmission efficiencies of the exemplary embodiments were relatively evaluated on the basis that the power transmission efficiency of the comparative example was regarded as 100%.

2. Data Signal Transmission Distance Range

An NFC reader/writer were connected to the NFC antenna of the integrated module through a cable. In addition, an NFC card in which an NFC IC chip and the same antenna as the NFC antenna provided in the integrated module are connected was manufactured. Thereafter, a data signal of 13.56 MHz was output through the NFC reader/writer, and the NFC card was placed in the vertical direction of the NFC antenna of the integrated module, and the maximum communication distance range was measured. As a result of the measurement, the data signal transmission distance ranges of the exemplary embodiments were relatively evaluated on the basis that the maximum communicable distance range of the comparative example was regarded as 100%.

3. Magnetic Security Signal Transmission Distance Range

A MST signal recognition unit designed to light up when the MST signal is recognized by a cable was connected to the output terminal of the MST antenna of the multifunctional integrated module. Then, as shown in FIG. 3, the maximum transmission distance range of the transmittable magnetic security signal was measured after locating the integrated module in the vertical direction of the leader head of the POS terminal in which a 10 kHz magnetic security signal was output. As a result of the measurement, the transmission distance ranges of the magnetic security signal of the exemplary embodiments were relatively evaluated on the basis that that the maximum transmittable distance of the comparative example was regarded as 100%.

TABLE 1

|  |  | Embodiment 1 | Embodiment 2 | Embodiment 3 | Embodiment 4 | Embodiment 5 | Embodiment 6 | Embodiment 7 | Comp. Example |
|---|---|---|---|---|---|---|---|---|---|
| Magnetic field shielding unit | Ribbon sheet permeability before shredding | 500 | 500 | 500 | 500 | 500 | 500 | 700 | — |
|  | Number of layers | 1 | 1 | 1 | 1 | 1 | 1 | 1 | — |
|  | Number of shredding | 3 | 4 | 7 | 9 | 2 | 1 | 3 | — |
|  | Average ratio of fragments of which diameters are less than 500 μm (%) | 77 | 82 | 100 | 100 | 46 | 32 | 100 | — |
|  | Average ratio of fragments of which diameters are less than 50 μm (%) | 4 | 17 | 44 | 53 | 0 | 0 | 28 | — |
| Integrated module | Wireless power transmission efficiency (%) | 122 | 133 | 135 | 130 | 119 | 110 | 135 | 100 |
|  | Data signal transmission distance range (%) | 117 | 118 | 123 | 123 | 109 | 107 | 120 | 100 |
|  | Magnetic security signal transmission distance range (%) | 124 | 145 | 138 | 128 | 118 | 107 | 140 | 100 |

As can be seen from Table 1, in the case of exemplary embodiments 1 to 6 using Fe-based alloys of Fe91.6Si2B6Co0.2Ni0.2 or the exemplary embodiment 7 using Fe-based alloys of Fe73.5Si13.5B9Cu1Nb3, all of the WPT efficiency, the data signal transmission distance, and the magnetic security signal transmission distance were improved in comparison with the comparative example due to the improvement of the antenna characteristics and the magnetic condensing effect by the magnetic field shielding unit.

However, among the exemplary embodiments, different physical properties were shown in the WPT efficiency, the data signal transmission distance, and the magnetic security signal transmission distance in accordance with the particle diameter size distribution of the fragments. As in the exemplary embodiment 6, it can be seen that the increase in the physical properties was small in comparison with the exemplary embodiment 5 when the average ratio of fragments less than 500 μm was 32%.

It can be seen that the WPT efficiency and the transmission distance of magnetic field security signal was reduced in the case of exemplary embodiment 4 in which the average ratio of fragments less than 50 μm in particle diameter size exceeds 50%.

As described above, the present disclosure has been described with respect to particularly preferred embodiments. However, the present disclosure is not limited to the above embodiments, and it is possible for one who has an ordinary skill in the art to make various modifications and variations, without departing off the spirit of the present disclosure.

What is claimed is:

1. A multifunctional integrated module, comprising:
an antenna unit including heterogeneous antennas; and
a magnetic field shielding unit, disposed on one surface of the antenna unit, including a magnetic field shielding layer which includes shredded Fe-based alloy fragments and a dielectric filling at least a part of gaps between at least a part of some adjacent ones of the shredded Fe-based alloy fragments, configured to improve characteristics of the antennas and condense a magnetic flux toward the antennas;
wherein the heterogeneous antennas have different operating frequency bands from each other or perform different functions from each other,
wherein the heterogeneous antennas include at least two types of antennas among a near field communication (NFC) antenna, a magnetic security transmission (MST) antenna, and a wireless power transmission (WPT) antenna,
wherein a number of Fe-based alloy fragments of which diameters are less than 500 μm accounts for 40% or more of a total number of the Fe-based alloy fragments,
wherein a number of Fe-based alloy fragments of which diameters are less than 50 μm accounts for 50% or less of the total number of the Fe-based alloy fragments.

2. The multifunctional integrated module of claim 1, wherein the heterogeneous antennas include two or more types of antennas among a first antenna having an operating frequency band of 5 kHz to 350 kHz, a second antenna having an operating frequency band including 6.78 MHz, and a third antenna having an operating frequency band of including 13.56 MHz.

3. The multifunctional integrated module of claim 1, wherein the magnetic field shielding unit further includes a protective member disposed on one surface of the magnetic field shielding layer and an adhesive member disposed on the other surface of the magnetic field shielding layer and attached to a surface of the antenna unit.

4. The multifunctional integrated module of claim 3, wherein the protective member is adhered to a top surface of the magnetic field shielding layer through a first adhesive layer which forms a surface of the protective member, and the adhesive member is adhered to a bottom surface of the magnetic field shielding layer through a second adhesive layer which forms a surface of the adhesive member, and wherein the dielectric included in the magnetic field shielding layer is formed such that a part of at least one of the first adhesive layer and the second adhesive layer permeates into the gaps between the Fe-based amorphous alloy fragments.

5. The multifunctional integrated module of claim 1, wherein the Fe-based alloy is a 3-element-based alloy including iron (Fe), silicon (Si) and boron (B) or a 5-element-based alloy including iron (Fe), silicon (Si), boron (B), copper (Cu), and niobium (Nb).

6. The multifunctional integrated module of claim 1, wherein the magnetic field shielding unit includes a plurality of the magnetic field shielding layers, and the dielectric includes a dielectric layer interposed between adjacent magnetic field shielding layers to adhere the adjacent magnetic field shielding layers to each other and reduce eddy currents.

7. The multifunctional integrated module of claim 6, wherein the dielectric layer interposed between the adjacent magnetic field shielding layers is an insulating adhesive layer or a heat-conductive heat-radiating adhesive layer.

8. The multifunctional integrated module of claim 1, wherein a single layer of the magnetic field shielding layer has a thickness of 15 μm to 35 μm.

9. The multifunctional integrated module of claim 1, wherein a number of Fe-based alloy fragments of which diameters are less than 500 μm accounts for 80% or more of a total number of the Fe-based alloy fragments.

10. A portable device comprising the multifunction integrated module of claim 1 as a receiving module.

11. An electronic device comprising the multifunctional integrated module of claim 1.

* * * * *